(12) United States Patent
Lee (10) Patent No.: US 8,152,335 B2
(45) Date of Patent: Apr. 10, 2012

(54) SUBSTRATE FOR DISPOSITION OF LIGHT-EMITTING DIODES

(75) Inventor: Wei-Long Lee, Taipei (TW)

(73) Assignee: Taiwan Oasis Technology Co., Ltd., Taipei (TW)

( * ) Notice: Subject to any disclaimer, the term of this patent is extended or adjusted under 35 U.S.C. 154(b) by 286 days.

(21) Appl. No.: 12/622,036

(22) Filed: Nov. 19, 2009

(65) Prior Publication Data

US 2010/0265711 A1    Oct. 21, 2010

(30) Foreign Application Priority Data

Apr. 16, 2009  (TW) .............................. 98206307 U (51) Int. Cl.
*F21S 4/00* (2006.01)
(52) U.S. Cl. .................. 362/249.06; 362/382
(58) Field of Classification Search ............ 362/249.06, 362/382, 630, 631, 249.01, 249.02; 324/750.03, 324/760.01, 762.01, 762.05
See application file for complete search history.

(56) References Cited

U.S. PATENT DOCUMENTS

| 5,404,282 A * | 4/1995 | Klinke et al. ............ 362/249.06 |
| 7,775,681 B2 * | 8/2010 | Kim et al. ................ 362/249.02 |
| 7,976,210 B2 * | 7/2011 | Shinozaki ..................... 362/631 |

* cited by examiner

*Primary Examiner* — John A Ward
(74) *Attorney, Agent, or Firm* — Jackson IPG PLLC; Demian K. Jackson (57) ABSTRACT

A substrate of the present invention is provided with a plurality of parallel-arranged functional sections. First and second connecting sections are provided on both ends of the functional sections. Every two adjacent functional sections are separable from one another and are respectively connected with different connecting sections so that the substrate can be separated into two daughter substrates having identical areas. The two daughter substrates of the substrate can be processed simultaneously before separated from each other, thus saving the processing time. When used by a user, one daughter substrate can be used independently as a light source or the two daughter substrates can be used opposite to each other so that the functional sections of the two daughter substrates are staggered.

8 Claims, 10 Drawing Sheets

SUBSTRATE FOR DISPOSITION OF LIGHT-EMITTING DIODES

BACKGROUND OF THE INVENTION (a) Field of the Invention

The present invention relates to a substrate for disposition of light-emitting diodes and more particularly to a substrate, which can be separated into two daughter substrates having identical areas so that the two daughter substrates of the substrate can be processed simultaneously to save the processing time and provide convenience to the user.

(b) Description of the Prior Art

The surface mounted technology is a packaging and assembly technology wherein electronic components are soldered on the surface of a printed circuit board or substrate, which belongs to one of the electronic component packaging technologies. A lightweight, compact and good quality electronic product can be assembled and manufactured by means of such technology. Therefore, it has gradually substituted for the traditional manual insertion mode of operation and becomes a mainstream in modern electronic assembly industry.

Figure 1:
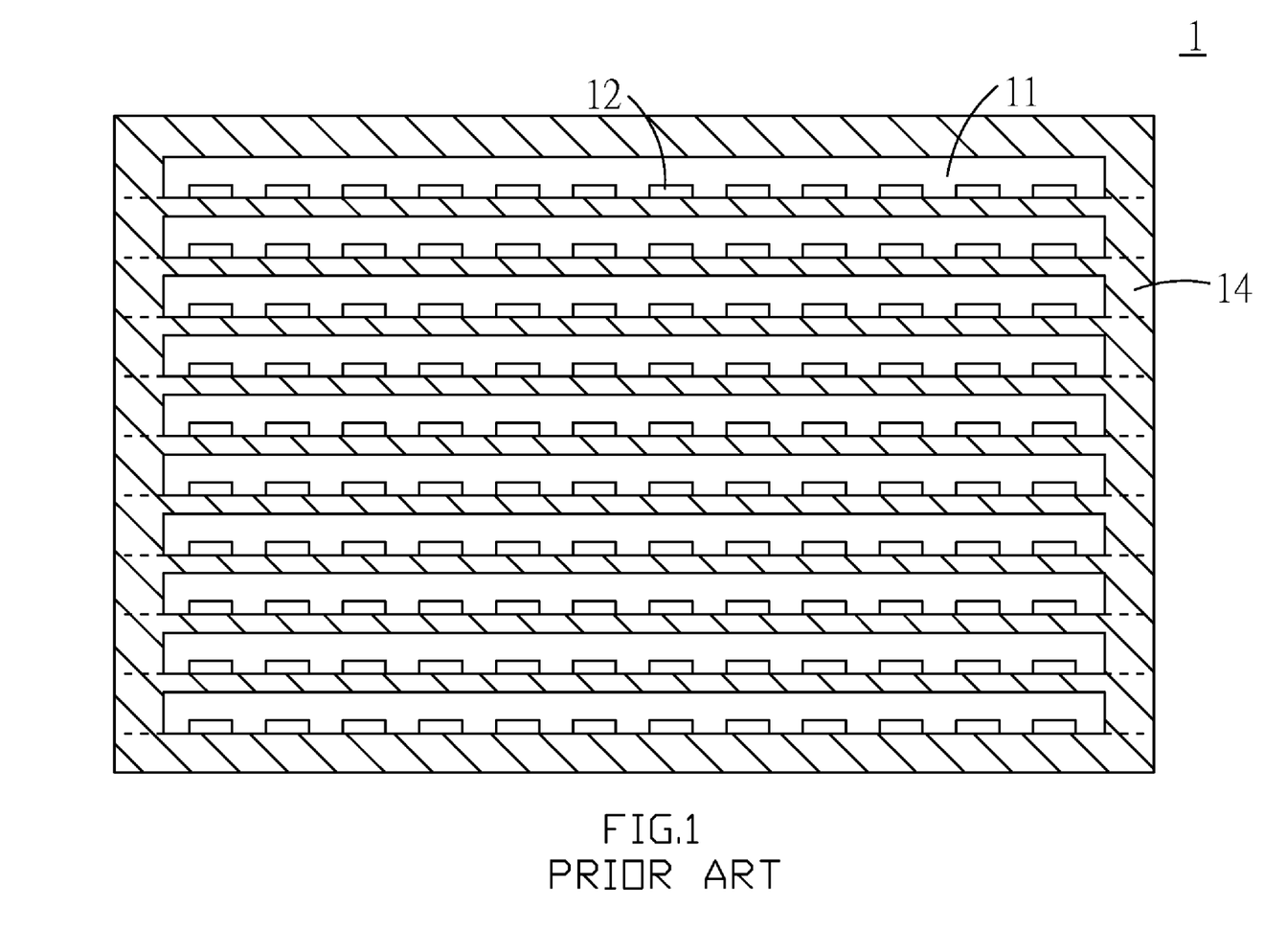
FIG. 1 is a schematic view showing a structure of an LED light strip of the prior art before cutting.
Figure 2:
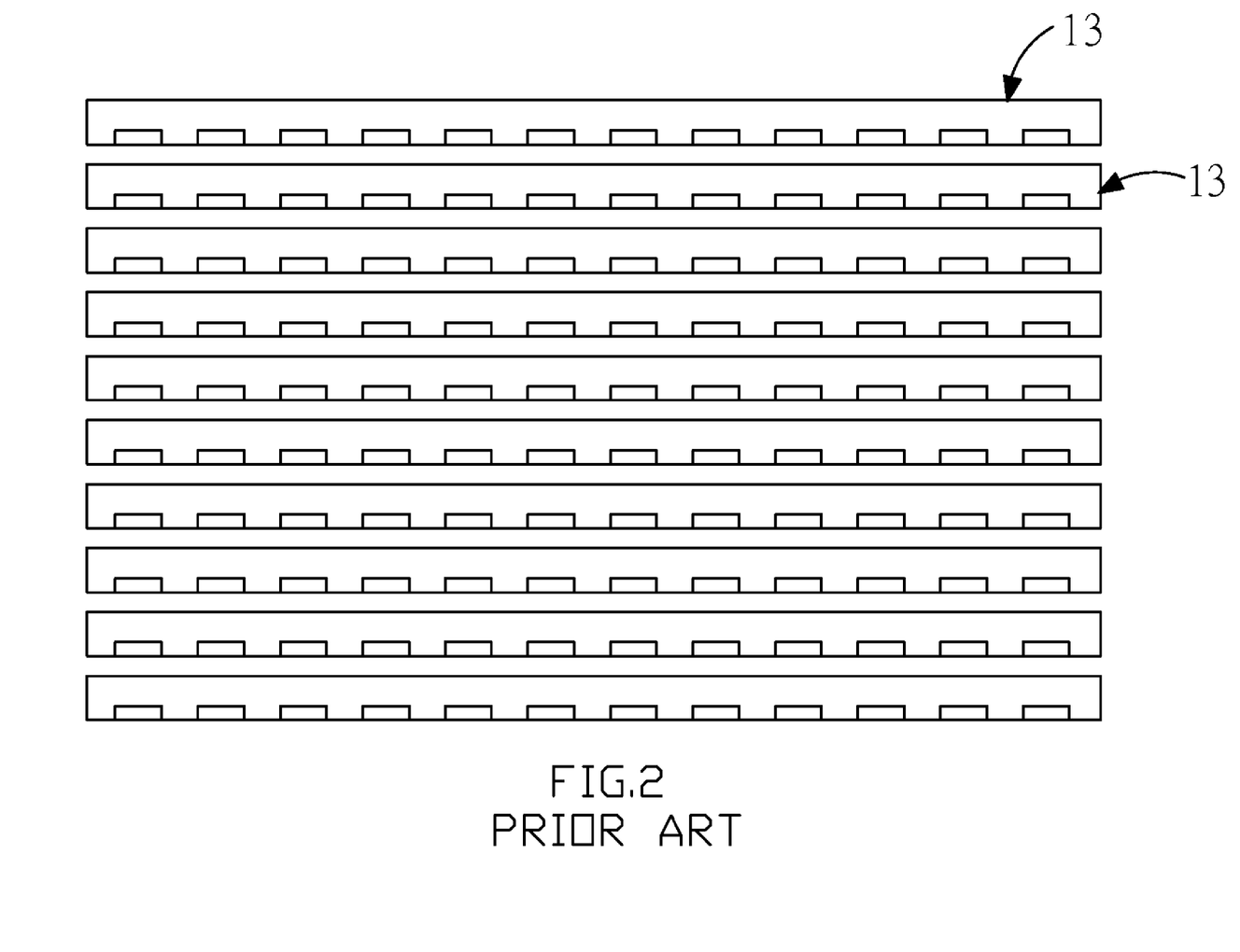
FIG. 2 is a schematic view showing a structure of an LED light strip of the prior art after cutting.

Referring to FIG. 1, in the manufacture of common LED light strips for a light source, a circuit board 1, which is provided thereon with a plurality of parallel spaced apart metal circuits 11, is placed on an SMT machine, the above-mentioned surface mounted technology is utilized to mount light-emitting diodes 12 one by one directly on the metal circuits 11 of the circuit board 1 in the SMT machine, and finally, the manufacturer cuts the circuit board along cutting lines between the metal circuits 11 to manufacture a plurality of LED light strips 13, as shown in FIG. 2. The strips can be arranged in a lamp box to form a light source or to form a luminous source for a common direct-type backlight module by downstream manufacturers.

However, some scrap material 14 is produced after the circuit board 1 has been cut, as shown in FIG. 1. The scrap material 14 cannot be used and it will result in a waste. When the plurality of LED light strips 13 are desired to be subsequently assembled or processed, they must be assembled or processed one by one because the LED light strips 13 are mutually separate. Not only is the process sophisticated, but also it takes a longer processing time.

Furthermore, if only a part of LEDs are damaged when a user uses a set of LED light strips, it is still necessary to replace the whole set and incurs waste in cost.

SUMMARY OF THE INVENTION

In view of the above-mentioned circumstances, a primary object of the present invention is to solve the above-mentioned drawbacks. The present invention relates to a substrate for disposition of light-emitting diodes and more particularly to a substrate, which can be separated into two daughter substrates having identical areas so that the two daughter substrates of the substrate can be processed simultaneously to save the processing time. After the processing is completed, the two daughter substrates can be separated from each other whereby the substrate results in the processing with no scrap material and its usable area doubles.

To achieve the foregoing object, a substrate of the present invention is provided with a plurality of parallel-arranged functional sections. First and second connecting sections are provided on both ends of the functional sections. Every two adjacent functional sections are separable from one another and are respectively connected with different connecting sections so that the substrate can be separated into two daughter substrates having identical areas. The two daughter substrates of the substrate can be processed simultaneously before separated from each other, thus saving the processing time. After the processing is completed, the two daughter substrates can be separated from each other whereby the substrate results in the processing with no scrap material and its usable area doubles. In application, the daughter substrates can be joined together as one piece by connecting the connecting sections with the functional sections. This provides convenience to the user and enables convenience in assembly.

DETAILED DESCRIPTION OF THE PREFERRED EMBODIMENTS

A substrate 2 for disposition of light-emitting diodes according to the present invention is provided with a plurality of parallel-arranged functional sections 21. Connecting sections are provided on end faces of the functional sections 21. Every two adjacent functional sections 21 are separable from one another and are respectively connected with different connecting sections, as shown in the first embodiment in FIGS. 3 and 4. The substrate 2 is provided with a plurality of parallel-arranged functional sections 21. First and second connecting sections 22, 23 are provided on both ends of the functional sections 21. Every two adjacent functional sections 21 are separable from one another and are respectively connected with different connecting sections 22, 23. In the embodiment shown in the figures, odd number rows of spaced adjacent functional sections 21 from top to bottom communicate with the first connecting section 22 to form a first substrate group, even number rows of spaced adjacent functional sections 21 communicate with the second connecting section 23 to form a second substrate group, whereby the substrate 2 can be separated into two daughter substrates 2' having identical areas.

Figure 3:
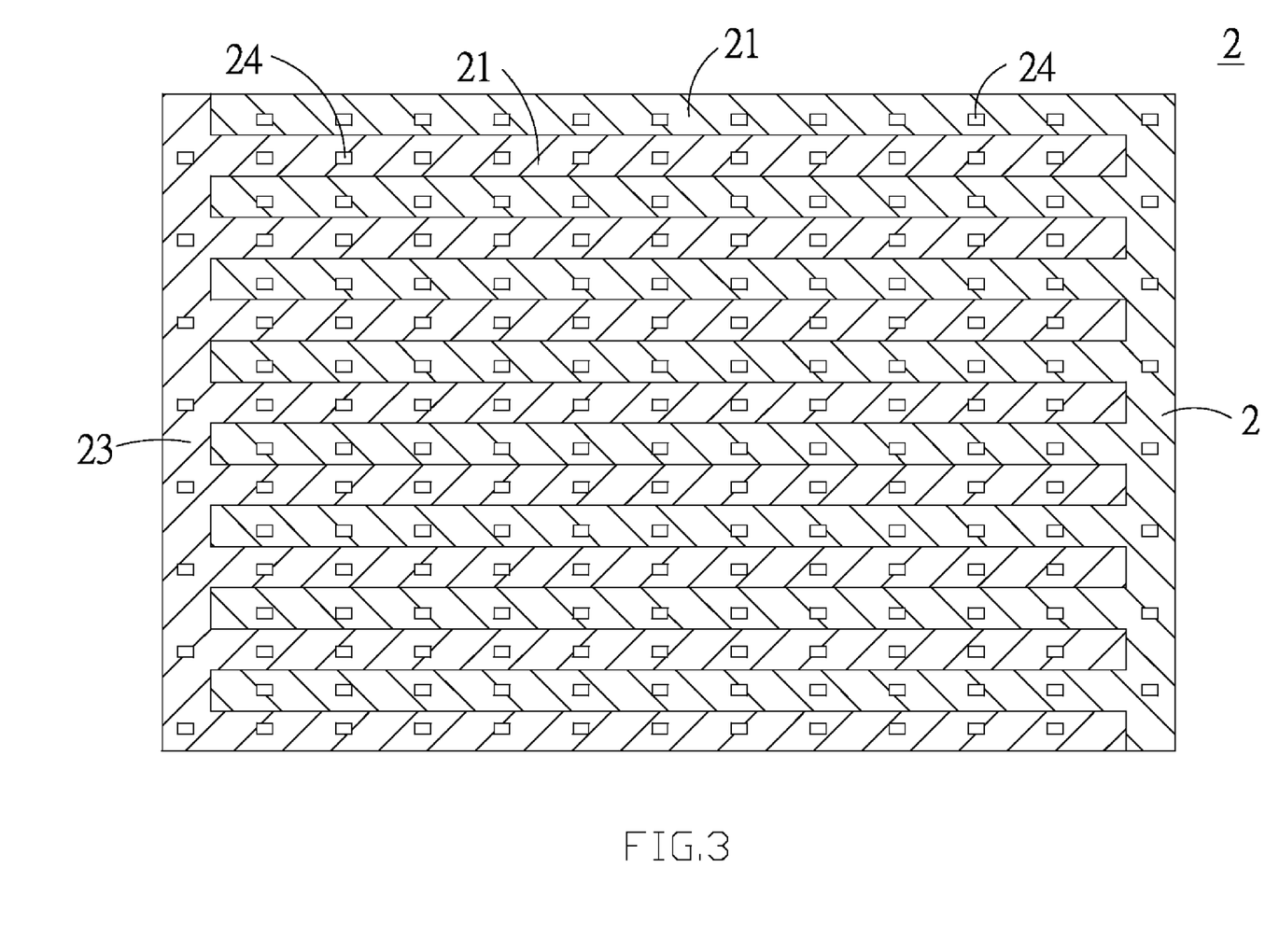
FIG. 3 is a schematic view showing a structure of daughter substrates of a substrate according to a first embodiment of the present invention before separated from each other.
Figure 4:
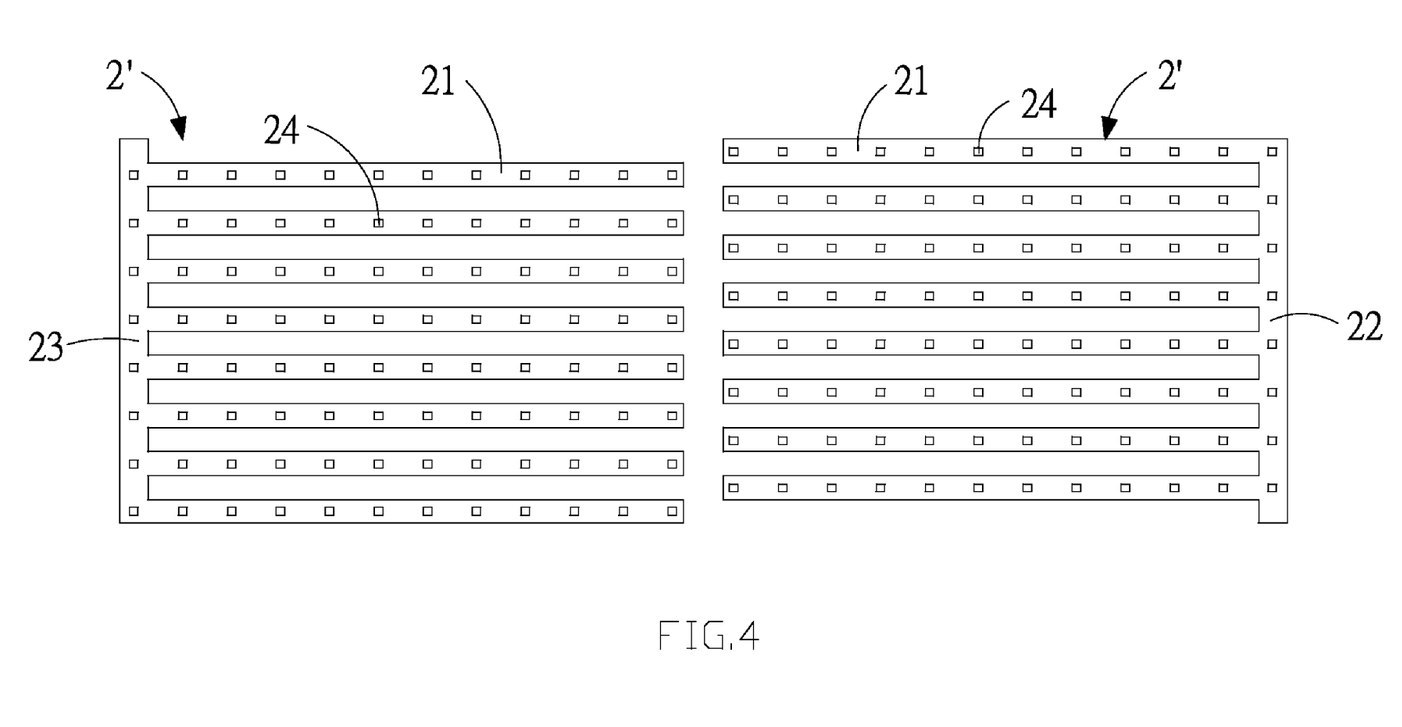
FIG. 4 is a schematic view showing a structure of daughter substrates according to a first embodiment of the present invention after separated from each other.

The two daughter substrates of the substrate can be processed simultaneously before separated from each other, for example, the two daughter substrates can be processed simultaneously such that the substrate 2 is provided thereon with circuits (not shown) and a plurality of light-emitting diodes 24, thus saving the processing time. After the processing is completed, the two daughter substrates can be separated from each other whereby the substrate results in the processing with no scrap material and its usable area doubles. In addition, the functional sections are connected as one piece by the connecting sections. This provides convenience to the user and enables convenience in assembly.

When used by a user, one daughter substrate 2' can be used independently as a light source or the two daughter substrates 2' can be used opposite to each other so that the functional sections 21 of the two daughter substrates 2' are staggered.

Figure 5:
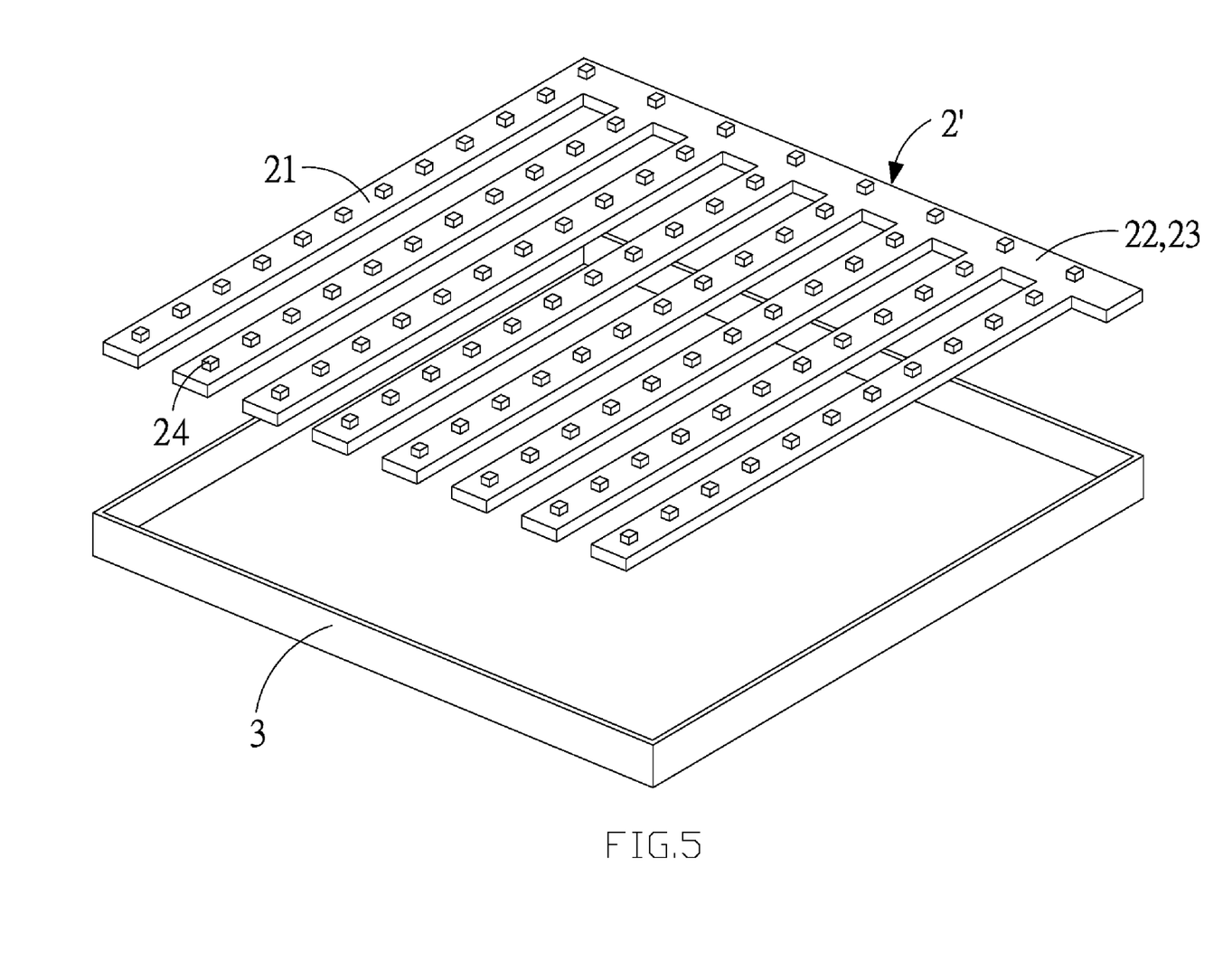
FIG. 5 is a structural exploded view of a daughter substrate and a lamp box according to the present invention.

As shown in FIG. 5, the daughter substrate 2' is formed with a plurality of strip functional sections 21 arranged in spaced adjacent pairs. Each of the functional sections 21 is thereon with a plurality of light-emitting diodes 24 and thus serves as a light strip. The daughter substrate 2' can be assembled in a lamp box 3 to form a light source device (they can also form a luminous source for a common direct-type backlight module).

Furthermore, connecting sections are provided on end faces of the functional sections 21, wherein pre-broken lines 25 are provided on the connecting section and the pre-broken lines are located between the functional sections 21.

Figure 6:
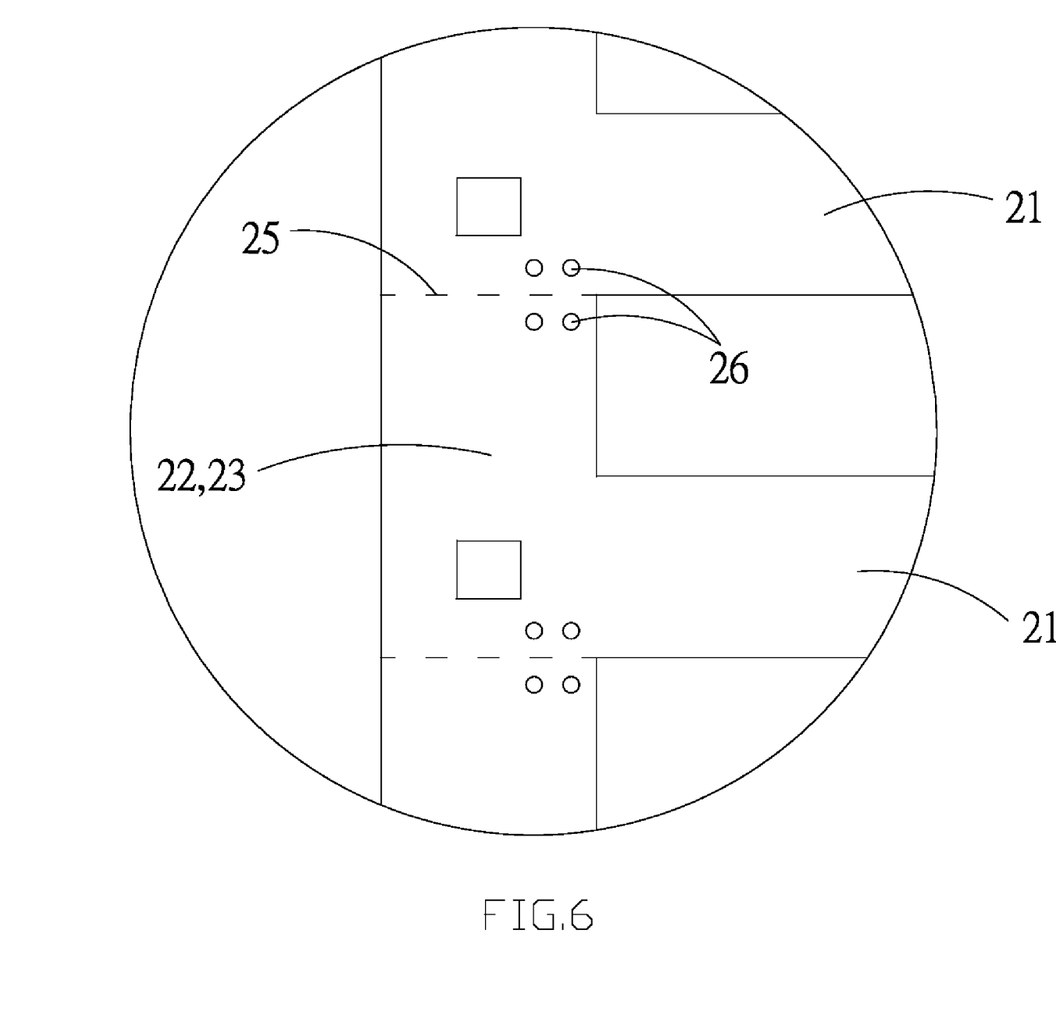
FIG. 6 is a partial enlarged schematic view of a daughter substrate according to the present invention.
Figure 7:
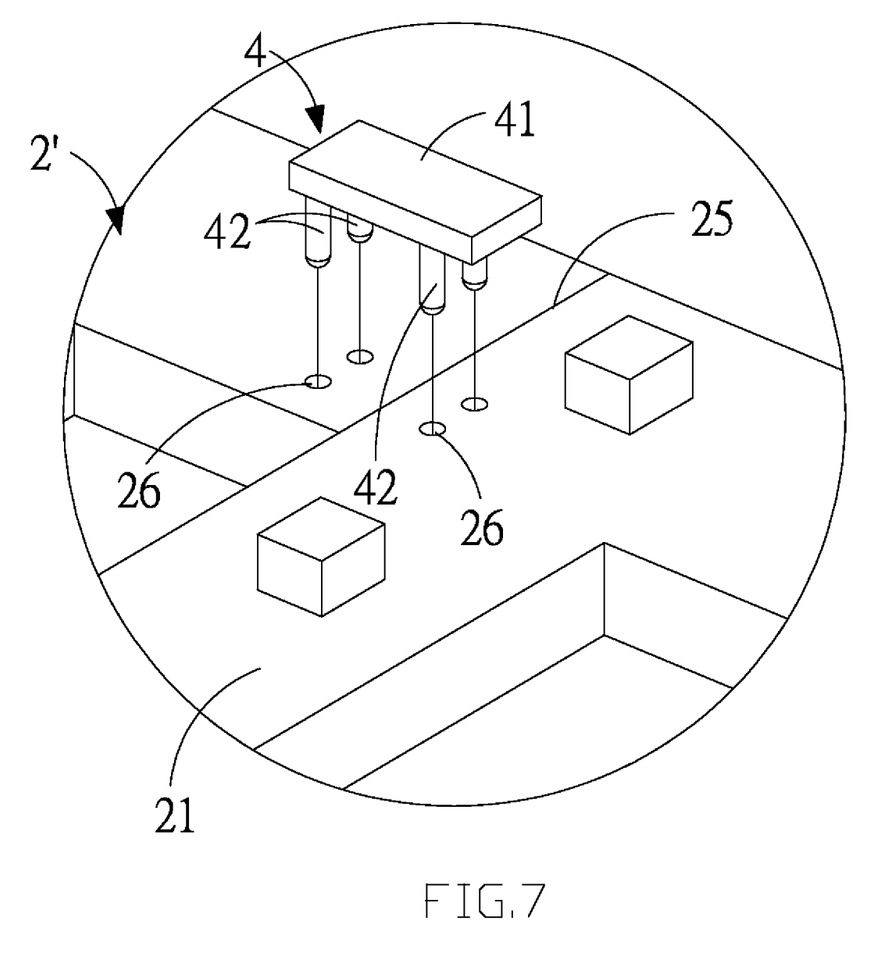
FIG. 7 is a structural exploded view of a daughter substrate and a retaining member according to the present invention.
Figure 8:
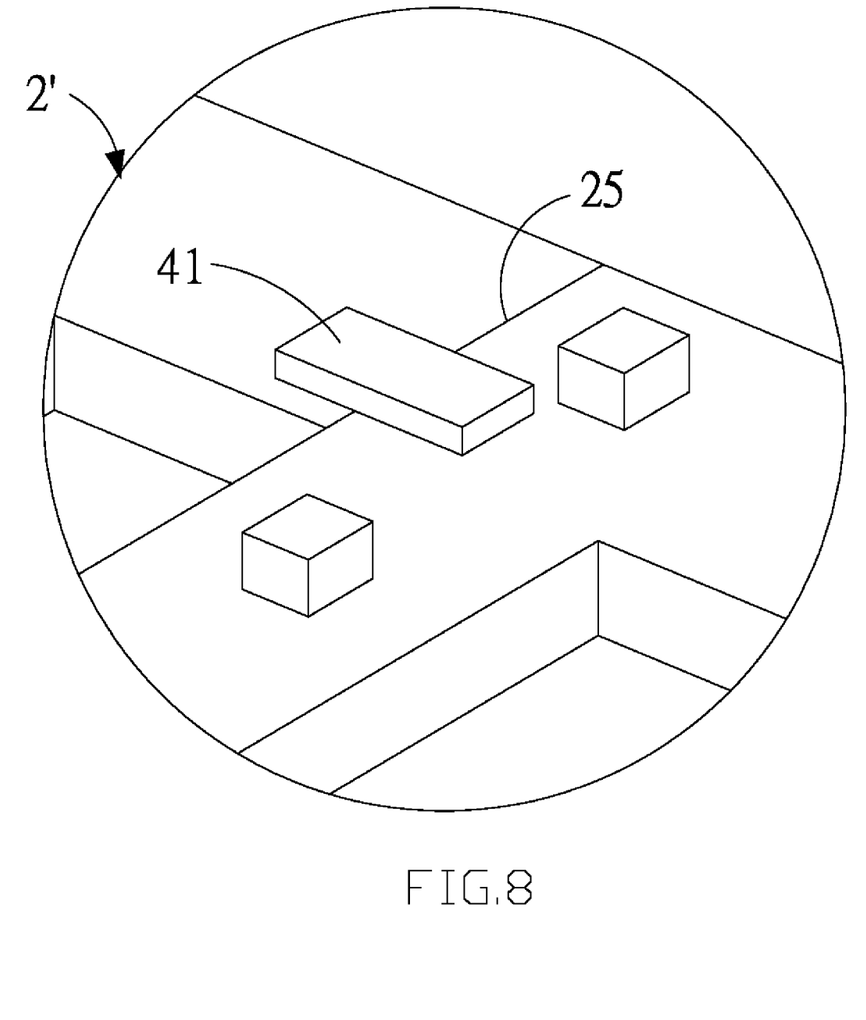
FIG. 8 is a three-dimensional view showing a structure of a daughter substrate on which a retaining member is assembled according to the present invention.

In this embodiment, the connecting sections are also formed as first and second connecting sections 22, 23, and pre-broken lines 25 are provided on the first and second connecting sections 22, 23, as shown in FIG. 6. The pre-broken lines 25 are located between the functional sections 21. At least one retaining hole 26 is disposed at each of both sides of the pre-broken line 25. The retaining holes 26 allow a retaining member 4 to be fastened therein, as shown in FIG. 7. The retaining member 4 is provided with a body 41 and insertion posts 42 insertable into the retaining holes 26. When it is necessary to replace circuits or light-emitting diodes 24 on one of the functional sections 21, the functional section 21 can be separated from the daughter substrate 2' by the pre-broken line 25. Also referring to FIG. 8, the body 41 of the retaining member is then mounted astride both sides of the pre-broken line 25 and the insertion posts 42 are fastened in the retaining holes 26 at both sides of the pre-broken line 25 to assemble and fasten a new functional section 21 to the daughter substrate. Of course, the retaining holes 26 may be made of an electrically conductive material and are electrically conducted with circuits of the functional sections. The insertion posts of the retaining member may be made of an electrically conductive material so that the circuits of the new and old functional sections can be connected by the insertion of the insertion posts into the retaining holes. In addition, an electrical connection device can be disposed to connect the circuits of the new and old functional sections.

Figure 9:
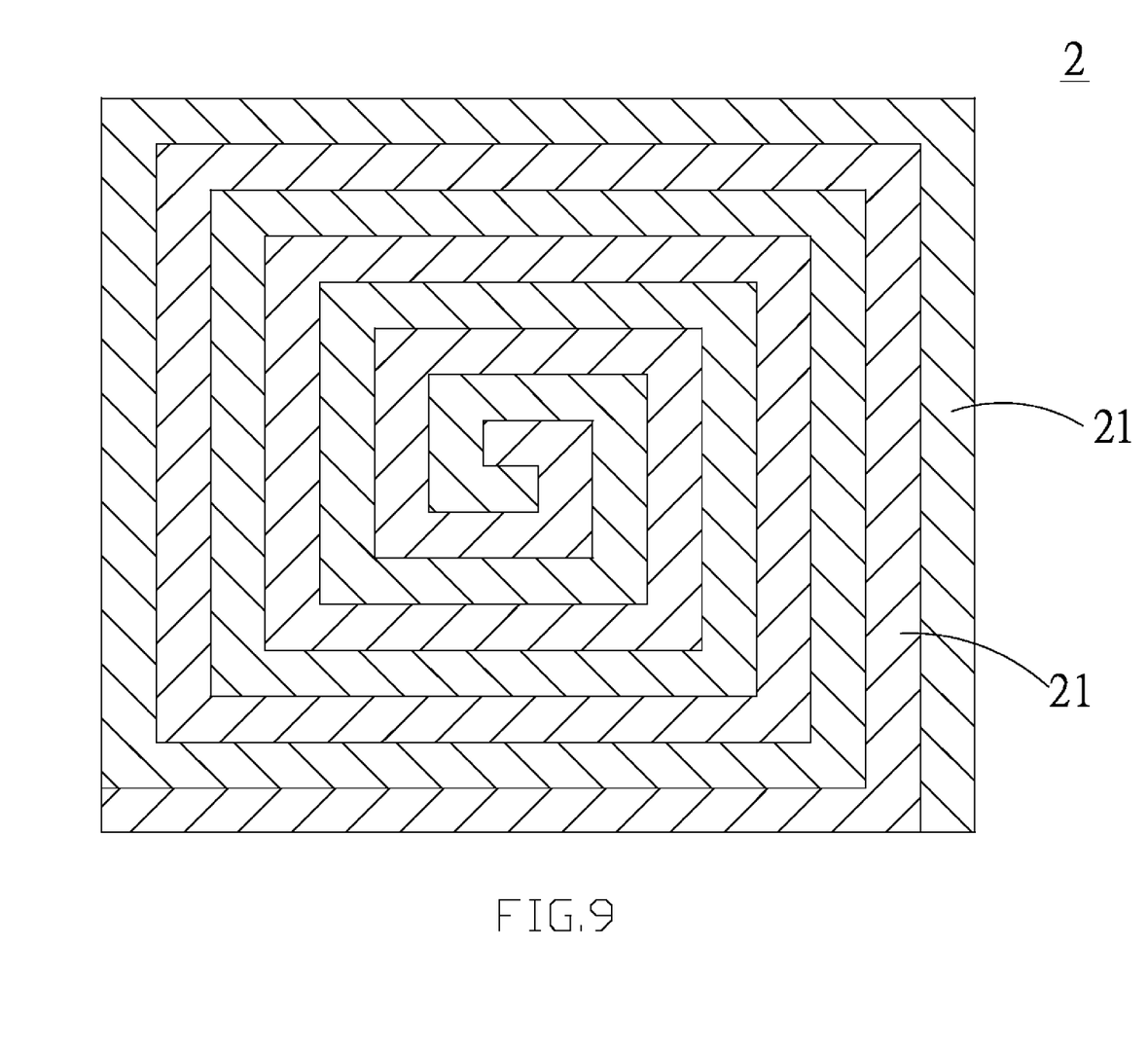
FIG. 9 is a schematic view showing a structure of daughter substrates of a substrate according to a second embodiment of the present invention before separated from each other.
Figure 10:
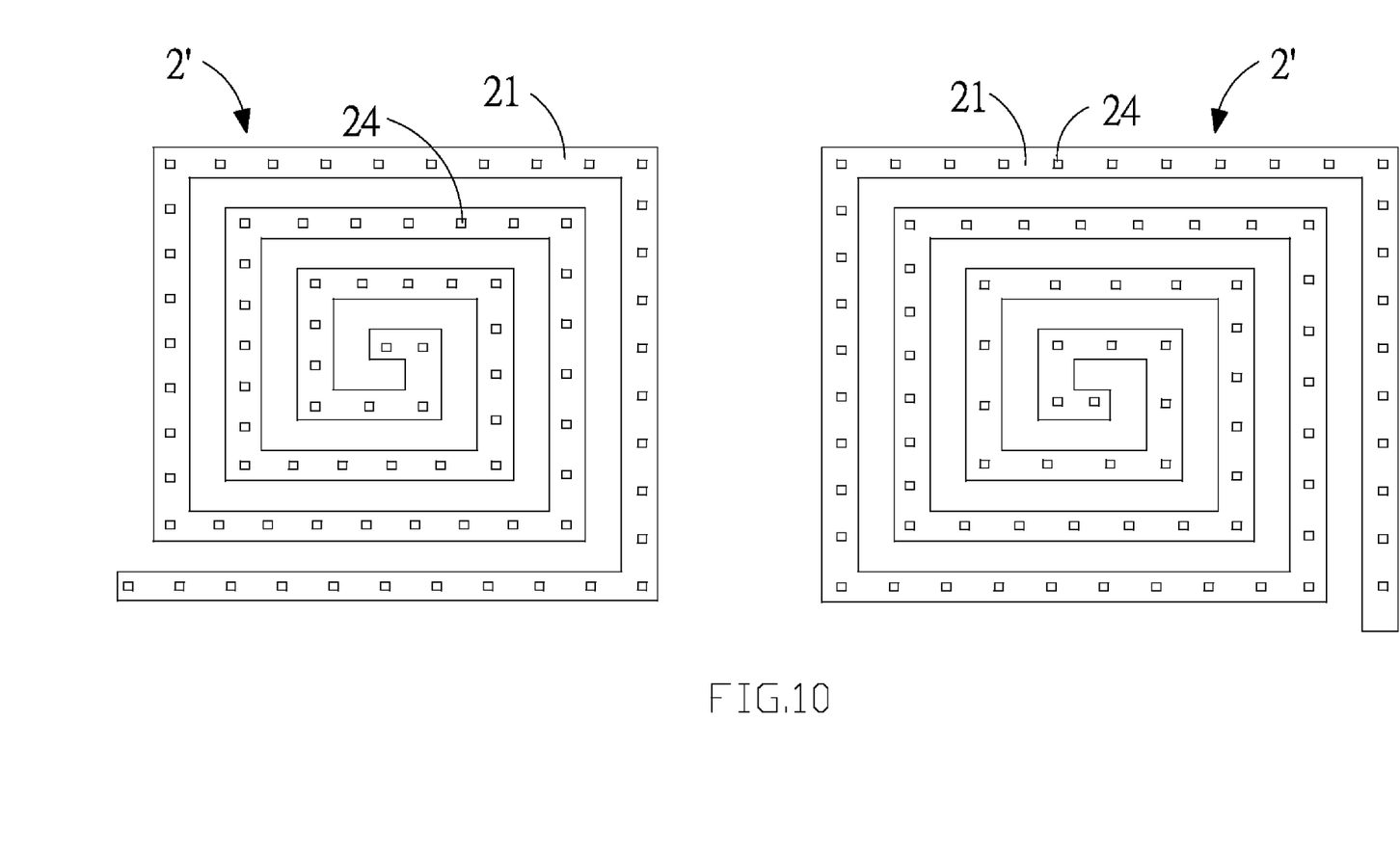
FIG. 10 is a schematic view showing a structure of daughter substrates according to a second embodiment of the present invention after separated from each other.

Moreover, in the second embodiment of the present invention as shown in FIG. 9, the substrate 2 is provided with at least two spirally wound functional sections 21. The functional sections 21 are arranged adjacently and separable from each other. The substrate 2 may be rectangular, and it can be separated into two rectangular spirally wound daughter substrates 2'. Each of the daughter substrates 2' is provided thereon with circuits (not shown) and a plurality of light-emitting diodes 24, as shown in FIG. 10. Of course, the substrate 2 may also be circular or elliptic.

As described above, the prevent invention provides an improved structure of a substrate for disposition of light-emitting diodes, and the application for a utility model patent is duly filed accordingly. However, it is to be noted that the preferred embodiments disclosed in the specification and the accompanying drawings are not limiting the present invention; and that any construction, installation, or characteristics that is same or similar to that of the present invention should fall within the scope of the purposes and claims of the present invention.

What is claimed is:

1. A substrate for disposition of light-emitting diodes, comprising: said substrate provided with a plurality of parallel-arranged functional sections, first and second connecting sections being provided on both ends of said functional sections, every two adjacent functional sections being separable from one another and being respectively connected with different connecting sections, and wherein pre-broken lines are provided on said first and second connecting sections, said pre-broken lines being located between said functional sections.

2. The substrate for disposition of light-emitting diodes as set forth in claim 1, wherein at least one retaining hole is disposed at each of both sides of said pre-broken line.

3. The substrate for disposition of light-emitting diodes as set forth in claim 2, wherein said retaining holes allow a retaining member to be fastened therein, and said retaining member is provided with a body which can be mounted astride both sides of said pre-broken line and insertion posts insertable into said retaining holes.

4. The substrate for disposition of light-emitting diodes as set forth in claim 3, wherein said substrate is provided thereon with circuits and a plurality of light-emitting diodes, said retaining holes are made of an electrically conductive material and are electrically conducted with said circuits of said functional sections, and said insertion posts of said retaining member are made of an electrically conductive material.

5. The substrate for disposition of light-emitting diodes as set forth in claim 1, wherein said functional sections communicate with said first connecting section to form a first substrate group and said functional sections communicate with said second connecting section to form a second substrate group.

6. The substrate for disposition of light-emitting diodes as set forth in claim 1, wherein said functional sections are arranged spirally.

7. The substrate for disposition of light-emitting diodes as set forth in claim 1, wherein said substrate is rectangular, circular, or elliptic.

8. The substrate for disposition of light-emitting diodes as set forth in claim 1, wherein said substrate is provided thereon with circuits and a plurality of light-emitting diodes.

* * * * *